(12) United States Patent
Heumüller et al.

(10) Patent No.: US 9,348,237 B2
(45) Date of Patent: May 24, 2016

(54) MASK CARRIER, MASK HANDLING MODULE AND METHOD FOR ADJUSTING A MASK

(75) Inventors: Michael Heumüller, Neuhof (DE); Heike Landgraf, Bruchköbel (DE); Michael König, Frankfurt (DE)

(73) Assignee: Applied Materials, Inc., Santa Clara, CA (US)

( * ) Notice: Subject to any disclaimer, the term of this patent is extended or adjusted under 35 U.S.C. 154(b) by 1075 days.

(21) Appl. No.: 12/860,533

(22) Filed: Aug. 20, 2010

(65) Prior Publication Data

US 2012/0037819 A1    Feb. 16, 2012

(30) Foreign Application Priority Data

Aug. 12, 2010    (EP) .................................. 10172693

(51) Int. Cl.
| | |
|---|---|
| *G01N 21/00* | (2006.01) |
| *G03F 7/20* | (2006.01) |
| *C23C 14/04* | (2006.01) |
| *C23C 14/56* | (2006.01) |
| *C23C 16/04* | (2006.01) |
| *C23C 16/54* | (2006.01) |
| *H01L 21/67* | (2006.01) |

(Continued)

(52) U.S. Cl.
CPC .......... *G03F 7/70733* (2013.01); *C23C 14/042* (2013.01); *C23C 14/56* (2013.01); *C23C 16/042* (2013.01); *C23C 16/54* (2013.01); *G03F 7/707* (2013.01); *H01L 21/6776* (2013.01); *H01L 21/67173* (2013.01); *H01L 21/67184* (2013.01); *H01L 21/67236* (2013.01); *H01L 21/67754* (2013.01); *G03F 7/12* (2013.01)

(58) Field of Classification Search
None
See application file for complete search history.

(56) References Cited

U.S. PATENT DOCUMENTS

| | | | |
|---|---|---|---|
| 2,260,471 A | 10/1941 | McLeod | |
| 2,410,720 A | 11/1946 | Dimmick | |
| 3,207,126 A * | 9/1965 | Byron | ........................... 118/721 |

(Continued)

FOREIGN PATENT DOCUMENTS

| | | |
|---|---|---|
| EP | 1717640 | 11/2006 |
| EP | 2 098 608 | 9/2009 |

(Continued)

OTHER PUBLICATIONS

Document entitled "Motion Control vol. 9, Precision Made in Germany, Micos," Copyright 2009, Micos GmbH (318 pages).

(Continued)

*Primary Examiner* — Charles Capozzi
(74) *Attorney, Agent, or Firm* — Fish & Richardson P.C.

(57) ABSTRACT

Mask carriers and mask alignment in vacuum deposition processes, mask handling modules, and methods for aligning a mask. A mask handling module can include a substrate carrier for carrying at least one substrate; a mask carrier for carrying at least two masks. The mask carrier can include at least two mask carrier sections each being adapted to carry a mask and a mask carrier positioning device for moving the mask carrier relative to the substrate carrier. The mask carrier sections are arranged so that the masks carried on the mask carrier sections can be positioned on the mask carrier in respective planes forming an angle with respect to each other so that only one of the at least two masks can be aligned to one of the at least one substrates.

10 Claims, 9 Drawing Sheets

(51) Int. Cl.
    *H01L 21/677*    (2006.01)
    *G03F 7/12*      (2006.01)

(56)                References Cited

U.S. PATENT DOCUMENTS

| | | | |
|---|---|---|---|
| 4,084,504 A * | 4/1978 | Fuchs | 101/115 |
| 4,121,537 A | 10/1978 | Maruyama et al. | |
| 4,207,836 A | 6/1980 | Nonaka | |
| 4,496,828 A * | 1/1985 | Kusmierz | C30B 25/12 |
| | | | 118/50.1 |
| 4,763,340 A | 8/1988 | Yoneda et al. | |
| 4,817,559 A | 4/1989 | Ciparisso | |
| 4,918,737 A | 4/1990 | Luethi | |
| 4,952,420 A * | 8/1990 | Walters | 427/96.8 |
| 4,969,416 A * | 11/1990 | Schumaker | C23C 16/455 |
| | | | 117/98 |
| 5,026,469 A | 6/1991 | Kunkel et al. | |
| 5,064,522 A | 11/1991 | Wellerdieck | |
| 5,138,974 A | 8/1992 | Ciparisso | |
| 5,154,810 A | 10/1992 | Kamerling et al. | |
| 5,335,594 A * | 8/1994 | Karlyn et al. | 101/35 |
| 5,398,271 A * | 3/1995 | Nishida et al. | 378/34 |
| 5,403,400 A | 4/1995 | Nishiguchi | |
| 5,474,641 A | 12/1995 | Otsuki et al. | |
| 5,558,909 A | 9/1996 | Poliquin et al. | |
| 5,662,785 A * | 9/1997 | Schertler | 204/298.25 |
| 5,845,569 A * | 12/1998 | Tkacz et al. | 101/115 |
| 6,090,444 A | 7/2000 | Wixon et al. | |
| 2010/0116871 A1* | 5/2010 | Gruber et al. | 228/244 |

FOREIGN PATENT DOCUMENTS

| | | |
|---|---|---|
| FR | 1444794 | 7/1966 |
| WO | WO2008/053140 | 5/2008 |
| WO | 2009/109464 | 9/2009 |
| WO | WO2009/109464 | 9/2009 |

OTHER PUBLICATIONS

Extended European Search Report issued in European Patent Application 10172693.3 on Feb. 28, 2011.
Uncertified machine translation of FR 1444794 published Jul. 1966.

* cited by examiner

MASK CARRIER, MASK HANDLING MODULE AND METHOD FOR ADJUSTING A MASK

CROSS-REFERENCE TO RELATED APPLICATION

This application claims priority to European Patent Application Serial No. 10172693.3, filed on Aug. 12, 2010, the contents of which are incorporated herein by reference.

TECHNICAL FIELD

This specification relates to the field of mask carriers and mask alignment in deposition processes. In particular, it relates to mask carriers, respective mask handling modules and methods for aligning a mask.

BACKGROUND

First products employing organic semiconductor devices have come to the market recently. Due to their unique properties organic semiconductor devices have a great potential to play an important role in many areas of photonics, such as lighting, energy harvesting or display applications. Even though promising results have been achieved with organic semiconductor devices on a lab scale, there still remain many unresolved issues related to the transfer to large scale production. Due to their intrinsic difference to well established inorganic semiconductors, it is often impractical to employ the ripened solutions from the inorganic semiconductor field in the field of organic semiconductors.

Thus, methods and apparatuses are required to facilitate more inexpensive and more reliable production processes for organic semiconductors.

WO 2009/109464 A1 refers to a method for coating a substrate, a coating apparatus for carrying out the method and a handling module for coating apparatuses. The handling module comprises a moveable support for a substrate to be coated, the support being movable between at least two positions. Further, a mask arranging device for at least one of attaching and detaching a mask to the substrate, and a mask alignment device for aligning the mask with respect to the substrate are provided for, wherein the mask alignment device is attached to the movable support so as to be movable together with the support. Alternatively, the handling module comprises a vacuum chamber, a moveable support for a substrate to be coated, the support being arranged in the vacuum chamber and being rotatable between at least two positions, wherein a mask arranging device for at least one of attaching and detaching a mask to the substrate is arranged within the vacuum chamber of the handling module.

WO 2008/053140 A1 discloses a mechanical scanner for ion implantation of a substrate, the mechanical scanner comprising a hexapod with a movable platform for holding the substrate, wherein the hexapod is arranged to have six degrees of freedom to allow the movable platform to be traversed relative to an ion beam along a predetermined path.

SUMMARY

Efficient organic semiconductor devices may be fabricated using evaporation processes. However, in such devices, structuring of the layers may be needed in the substrate plane, e.g. in order to define pixels and electric connections in devices comprising arrays of organic light emission devices. This structuring can be achieved by introducing a mask with preformed structures during the evaporation process.

The present disclosure describes a mask handling module for aligning a mask to a substrate. The mask handling module comprises a substrate carrier for carrying at least one substrate; a mask carrier for carrying at least two masks, wherein the mask carrier comprises at least two mask carrier sections each being adapted to carry a mask, and a mask carrier positioning device for moving the mask carrier relative to the substrate carrier, wherein the mask carrier sections are arranged so that the masks carried on the mask carrier sections can be positioned on the mask carrier in respective planes forming an angle with respect to each other so that only one of the at least two masks can be aligned to one of the at least one substrates. This configuration may facilitate a fast and reliable placement and picking of two or more masks in an evaporation device. In this way, e.g., the evaporation device can be comfortably configured to deal with different substrate sizes and/or mask sizes. For instance, in a first run of the evaporation device a single Generation 4 (e.g. 730×920 mm) substrate can be equipped with two different or equal masks. Then, in a second evaporation run, two Generation 2 (400×500 mm) substrates can be equipped with two masks. In a conventional evaporation device for Generation 4 the mask handling system may also be configured for Generation 4 masks only. In such a system, it may be difficult to equip two Generation 2 substrates with corresponding masks. As both masks may have to be placed in a single placement step, it may be difficult to achieve a necessary alignment precision. By employing the described modules and mask carriers such problems may be avoided. Two (or more) masks can be placed and picked serially in a precise manner on one or more substrates without unwanted interference. Thus, a very flexible and scalable masking process may be provided.

In other aspects, while one of the at least two masks is aligned the at least one other mask does not come into contact with any of the at least one substrates.

In other aspects, the mask carrier positioning device is adapted to bring at least one of the at least two masks into contact with one of the at least one substrates.

Depending on the circumstances, it may be advantageous to bring the mask in direct contact with the substrate or not. In some situations, e.g., the surface of the substrate may be very sensitive so it is desirable to arrange the mask in some distance of the surface of the substrate still sufficiently small to guarantee a predetermined quality, e.g. a resolution or steepness of flanks, of the deposited structures. In other situations it may be desirable to bring a mask in direct physical contact with the surface of the substrate. This may make the alignment process simpler and may yield maximal resolution of the evaporation process.

In other aspects, the mask carrier positioning device is adapted to align the at least one of the at least two masks coplanar to one of the at least one substrates. Before placing the mask, e.g. bringing it into contact with the substrate, it may be required to bring the mask in a coplanar position with the substrate before beginning the final approach to the substrate to place the mask. If the plane including the mask and a plane including the substrate form an angle that may damage the substrate or the mask upon approach of the substrate or lead to varying structures across the substrate area in a following deposition process in case the mask is placed with an angle due to varying distances between the surface of the substrate and the mask.

In other aspects of the handling module, the substrate carrier is adapted to carry two or more substrates. This allows to process different substrate sizes in the deposition device without extensive reconfigurations. The handling modules may be of particular use in such cases as the mask carrier can have a number of sections corresponding to the number of substrates. In such manner, each mask can be placed separately onto the substrate. This may enhance mask placement accuracy. In systems operating only with a single mask such a substrate to substrate alignment may not be possible so placement errors of the substrates that introduce transversal or rotational offsets between the substrates not perfectly aligned in a single plane and at predetermined positions may not be correctable. This advantageous effect of the module may also be present if few (e.g. two, four, six, eight) substrates or a larger number of substrates processed simultaneously are equipped with a common mask. It is believed that placement errors scale at least linearly with a distance from, e.g., a center of a mask so using more than one mask may reduce such errors. In addition, already existing masks for certain substrate areas may be also used in deposition devices configured to handle larger substrates.

In other aspects, the substrate carrier is configured to carry the at least one substrate in a single planar plain. In other aspects, the mask handling module is adapted so that two of the at least two masks can be aligned to one of the at least one substrates. In other aspects of the handling module, the mask handling module is adapted so that each mask is aligned to a different substrate.

In other aspects, the substrate carrier is adapted to carry at least one substrate having a size between 100×125 mm to 3000×3700 mm, optionally between 400×500 mm to 1500× 1850 mm, further optionally between 600×700 mm to 1200× 1300 mm, and further optionally between 730×920 mm and 1020×1200 mm.

In other aspects, the mask carrier positioning device comprises a six-axes movement control. To achieve full flexibility in positioning the two or more masks, six axes (three independent translation and rotational axes) may be required. Whereas in some modules fewer movement axes may suffice to place or pick the masks, in some implementations the mask handling module has a mask carrier positioning device configured to be moved in all six directions. This is especially important when the number of masks exceeds two or the requirements for precision are particularly high, e.g. in display production.

In other aspects, the substrate carrier and the mask carrier are arranged so that the at least one substrate and the at least two masks can be held in substantially vertical positions. A vertical configuration of a substrate handling module may be advantageous as bending of both, substrate and masks, which may occur in horizontal modules may be reduced or prevented. This results in a more accurate formation of structures. Moreover, the bending may also affect the precision of the mask placement. The afore-mentioned issues are of particular importance for organic semiconductor devices, as these may also be deposited on very thin or flexible substrates (e.g. plastic foil). Having a vertical module, no additional measures may have to be taken to prevent such bending resulting in a simpler and inexpensive handling module. Furthermore, thinner masks may be employed what also may result in a higher precision in deposition. In combination with the mask handling module, a vertical substrate position may ensure a predetermined accuracy in mask placement.

In other aspects, the mask handling module is suitable to be used in a vacuum environment, especially inside a vacuum deposition device. This may require that parts of the mask handling module, or the complete mask handling module may be configured to operate under vacuum conditions. This may require vacuum proof electronics and drives, in particular for the mask carrier positioning devices and the alignment control system. Parts of said devices and systems may be arranged outside the vacuum chamber. In alternative devices, the mask handling system is suitable to be operated under inert gas conditions (e.g. nitrogen atmosphere) and/or under conditions including an atmosphere basically devoid of water vapor. The devices, in particular the moving parts, may additionally be configured to have low abrasion to prevent any contamination of the substrate.

A mask carrier for carrying at least two masks comprises at least two mask carrier sections each being adapted to carry a mask, wherein the mask carrier sections are arranged so that the masks carried on the mask carrier sections can be positioned on the mask carrier in respective planes forming an angle with respect to each other. The angle meant in this context is understood not to be 0°, i.e. the respective planes are not in the same plane.

In other aspects, the at least two mask carrier sections are fixedly positioned with respect to each other. This configuration may ensure a simple and robust design.

In other aspects, the at least two mask carrier sections are pivotably mounted with respect to each other. In such manner, the mask carrier may be adjustable to adapt to numerous predefined process situations. For instance, different types of masks may require different angles between the planes including the at least two masks. In some cases, a first set of masks may be thinner than a second set of masks. Than, if the mask carrier may be arranged to place and pick the first set of masks, this arrangement may be unsuitable for the second set of masks. By changing the angle by the pivotable mount, the mask carrier may then be adjusted to the second set of masks. The pivotable mount may also be used to change the angle between the masks substantially to 0°, such that both masks are in a single plane. In such a manner, the mask carrier can also be adjusted to handle a single mask covering the at least two sections. This configuration may be employed whenever the placement accuracy of a single larger mask may be sufficient and a speed-up in placing and picking-up the masks may be desired. In implementations where the mask carrier includes more than two mask carrier sections, the pivotable mounts can be used to flexibly configure the mask carrier sections by forming larger planar sections by combining two or more mask carrier sections. This further enhances the flexibility of devices including such mask carrier in handling efficiently substrates and masks with different areas.

In other aspects, the angle is the acute angle formed by the respective planes and the angle is in the range from 0.01° to 30°, optionally from 0.1° to 10°, further optionally from 0.5° to 5°, further optionally from 0.5° and 1.5°.

In other aspects, each mask carrier section is adapted to carry a mask having a size between 210×260 mm to 3200× 4000 mm, optionally between 420×520 mm to 1600×2000 mm, further optionally between 460×560 mm to 1260×1360 mm, further optionally between 500×600 mm to 1020×1220 mm.

In other aspects, the mask carrier comprises at least one alignment control device. The mask carriers may be movable in a number of directions, in particular in three independent translational and rotational directions, in order to place a mask accurately onto a substrate. In some cases, this may be sufficient in order to achieve an accurate and reliable placement and picking of the masks. Nevertheless, it might be necessary to include a further device to control the alignment and in order to give a feedback during the alignment process. This alignment process device is of particular importance for flexible mask carriers. As from run to run of a deposition device the configuration of the substrate carrier and the mask carrier may change (e.g., in terms of numbers of masks or angles of the different mask carrier sections) an additional control may be important to enhance the accuracy of the alignment.

In other aspects, each mask carrier section is equipped with a respective alignment control device. This configuration may be advantageous as the respective alignment control devices may be arranged in a fixed manner. This may provide a robust arrangement as the different alignment control systems do not have to be movable.

In other aspects, all mask carrier sections share a single alignment control device which is optionally adapted to be moved to each mask carrier section. This configuration may be of particular advantage in a system comprising a costly alignment control system, e.g. a high resolution camera. Having a multitude of such systems in a device including a mask carrier with two or more masks may increase the cost of the device. By having an alignment device movable to each section this additional cost may be lowered by merely adding a comparably cost efficient movement system.

In other aspects, the mask carrier sections comprise switchable magnets for carrying masks comprising permanent metallic sheet material.

In other aspects, the mask carrier is adapted to be used inside a vacuum chamber.

A method is directed to aligning a mask to a substrate in a mask handling module, comprising: aligning a first mask to a first substrate carried by a first substrate carrier by moving a mask carrier for carrying at least two masks relative to the first substrate carrier adapted to carry one or more substrates, aligning a second mask of the at least two masks to a second substrate carried by a second substrate carrier by tilting the mask carrier with respect to the first substrate.

Further aspects include that the first substrate and the second substrate denote the same substrate or different substrate; and wherein the first substrate carrier and the second substrate carrier denote the same substrate carrier or different substrate carriers.

Further aspects include that the first mask and the second mask are aligned to the same substrate and/or that the first mask and the second mask are attached to the substrate.

Further aspects include that the first mask and the second mask are attached to different substrates carried either by the same substrate carrier or carried by different substrate carriers.

Further aspects include that the first mask and the second mask are aligned coplanar to the respective substrate.

SHORT DESCRIPTION OF THE FIGURES

FIG. 5 shows a schematic drawing of a mask carrier and a substrate carrier having four mask carrier sections.

DETAILED DESCRIPTION

Figure 1:
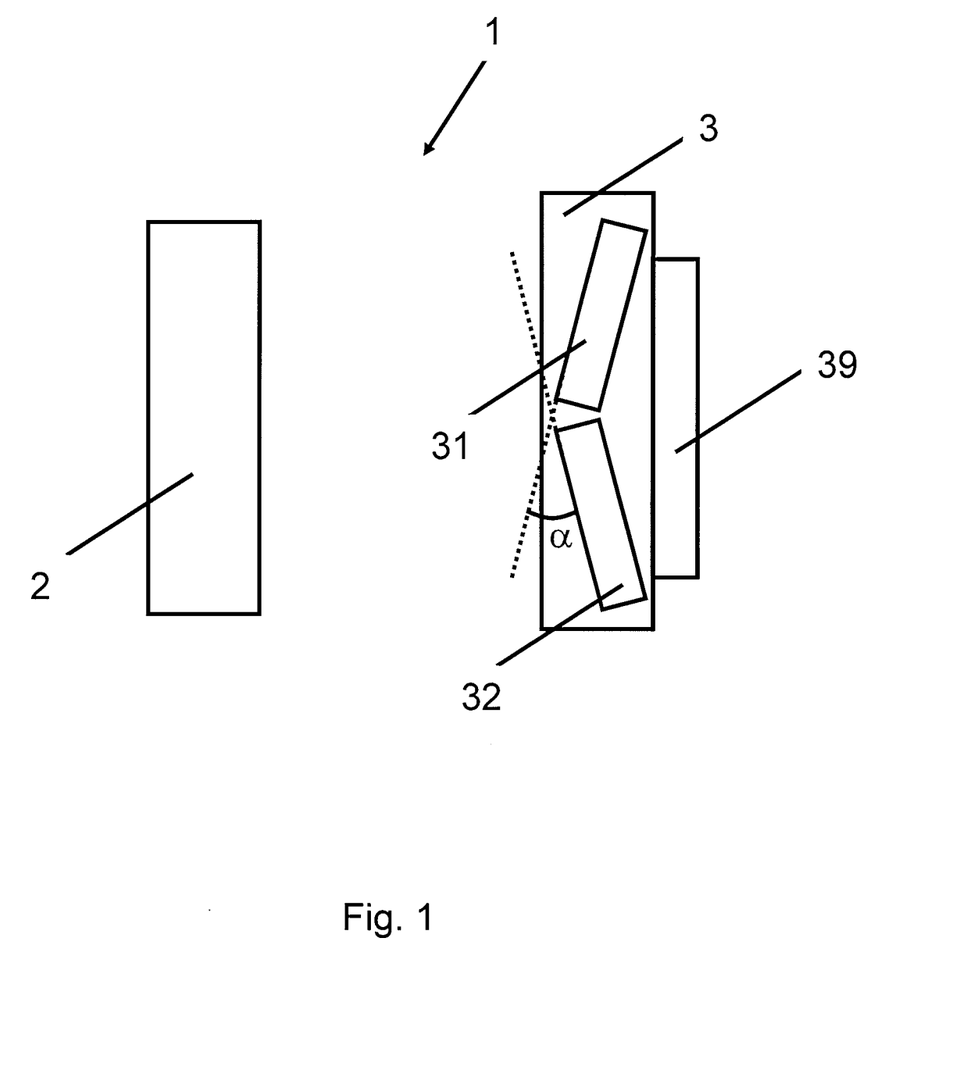
FIG. 1 shows a schematic drawing of a mask handling module.

FIG. 1 depicts a mask handling module 1 for aligning two masks to a substrate.

The mask handling module 1 comprises a substrate carrier 2 for carrying at least one substrate; a mask carrier 3 for carrying at least two masks, wherein the mask carrier comprises at least two mask carrier sections 31, 32, each being adapted to carry a mask; and a mask carrier positioning device 39 for moving the mask carrier relative to the substrate carrier 2; wherein the mask carrier sections 31, 32 are arranged so that the masks carried on the mask carrier sections 31, 32 can be positioned on the mask carrier 3 in respective planes forming an angle $\alpha$ with respect to each other so that only one of the at least two masks can be aligned to one of the at least one substrates.

In this application "planes forming an angle" refers to a configuration where the planes are arranged in a way to intersect. In particular, this excludes that the at least two mask carrier sections 31, 32 are arranged in a fixed manner so that the at least two masks are positioned in coplanar planes forming an angle $\alpha$ of 0° (180°, respectively). Except this situation, the mask handling module 1 can comprise any angle $\alpha$ formed by respective planes including the masks. Preferably, the angle $\alpha$ is selected to be minimal, i.e. just large enough that the at least two masks can be each placed or picked without, while picking or placing one of the at least two masks, the remaining masks interfere, e.g. come in contact with the substrate. This minimal angle $\alpha$ may be determined by the placement of the at least two masks on the mask carrier sections 31, 32, e.g. the distance from the two or more masks to one or more lines of intersection of the planes including the two or more masks and/or a thickness of the two or more masks and/or any distance between the two or more masks when placed onto the substrate and the substrate. In general, two or more masks placed on a mask carrier in a substantially plane fashion, even if the planes including the masks form a small angle by coincidence (e.g. dirt particles, material imperfections) are not mounted in this sufficiently large angle $\alpha$. The angle $\alpha$ can also be selected to be larger than this minimal value. For instance, the angle $\alpha$ can be larger than 0.01°, larger than 0.1°, larger than 0.5°, or larger than 1°.

Except for avoiding interference while placing and picking the at least two masks, the choice of the angle $\alpha$ may also include constructive considerations. It may be advantageous to choose an angle, e.g. a larger angle than a predetermined angle, in order to arrange the masks in a predetermined manner.

The mask carrier positioning device 39 may include any device configured to move the masks relative to the substrate carrier 2. In particular, the traverse paths may be selected to be sufficient to place or pick the masks in a predetermined manner onto or from the substrate. In particular, the mask carrier positioning device 39 may include at least an actuator for rotating the at least two masks about an axis parallel to the line of intersection of the two planes including the at least two masks. In such a system, the at least two masks may be rotationally moved to be substantially coplanar with a plane including the substrate. Moreover, the mask carrier positioning device 39 may also be configured to comprise a second actuator for rotating the mask carrier about a second axis arranged orthogonal to the first rotation axis. In some implementations, the second rotation axis may also be orthogonal to the plane including the substrate. Furthermore, the mask carrier positioning device 39 may also comprise a rotational actuator configured to rotate the mask carrier 3 in a third direction with a rotation axis orthogonal to the first and the second rotation axes. In such a system, the planes including the at least two masks may be rotated so that the normal on the surfaces including the at least two masks may point into any direction inside predetermined operation ranges of the actuators.

Furthermore, the mask carrier positioning device 39 may include actuators for moving the mask carrier in at least one translational direction. In other implementations the mask carrier positioning device 39 may be configured to move the mask in two orthogonal transitional directions. In particular, the plane spanned by said two orthogonal directions may be substantially coplanar to the plane including the substrate. The mask carrier positioning device 39 may also be configured to move the substrate in three orthogonal transitional directions. In such an arrangement, the mask carrier may be translated to any position inside a predetermined operation range of the actuators.

In some implementations, the mask carrier positioning device 39 comprises at least an actuator for rotating the two or more masks about an axis parallel to the line of intersection of the two planes with an actuator for moving the mask carrier 3 in a translational direction orthogonal to the plane including the substrate. This may be used to approach one of the two or more masks to the substrate or in order to pick up a mask, preferably after the one of the two or more masks has been rotated in a substantially coplanar configuration with the substrate. In addition, the mask carrier positioning device 39 may also comprise two additional transverse actuators configured to translate the one of the two or more masks in a plane coplanar to the substrate. This may serve to exactly position the mask with respect to a substrate, e.g. in a process where different structured layers are deposited on top of each other and proper alignment of these structured layers is required to achieve an efficiently working device.

In other implementations, the mask carrier positioning device 39 comprises three rotational and three translation actuators in order to move any of the at least two masks in any position with respect to the plane including the substrate. The different actuators can work independently or dependently from each other. In some implementations, the mask carrier positioning device 39 comprises a hexapod kinematic mount connected to a back side of the mask carrier. Such a configuration provides a compact and efficient device to move and rotate the at least two masks in three rotational and translational directions, respectively.

In the mask handling modules 1 the substrate carrier can also include a device for positioning. In general, the substrate carrier positioning device may include all actuators listed above in connection with the mask carrier positioning device 39.

In particular, the substrate carrier positioning device may comprise actuators to rotate the substrate carrier about an axis parallel to the plane including the substrate. In addition, the substrate carrier positioning device may also comprise actuators configured to translate the substrate carrier in two orthogonal directions in the plane including the substrate. In systems having both, a substrate carrier positioning system and a mask carrier positioning system 39, both systems may be configured to cooperative move the substrate and one of the two ore more masks, respectively, to carry out a placement or picking up of a mask.

Figure 3A:
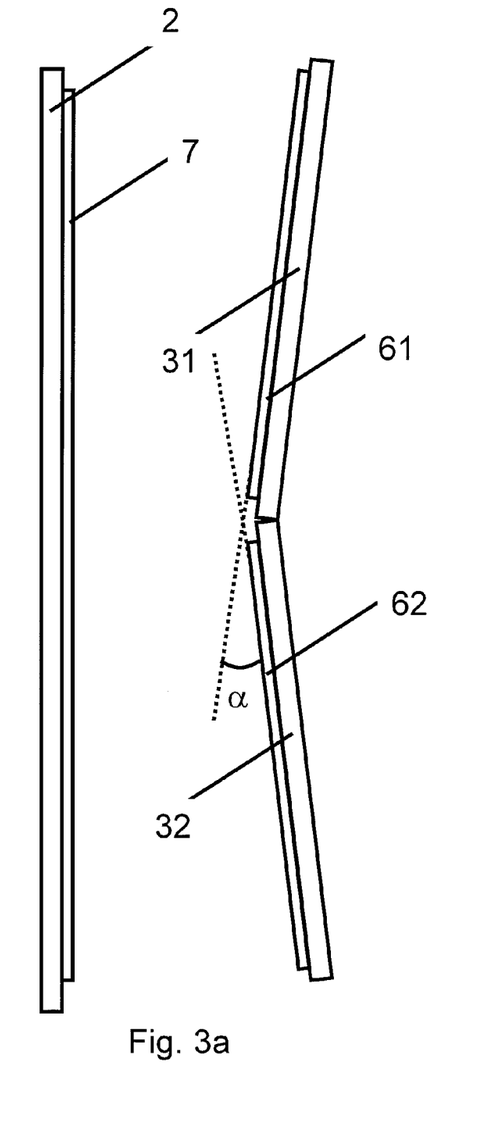
FIG. 3a shows a schematic drawing of a mask carrier and a substrate carrier.
Figure 3B:
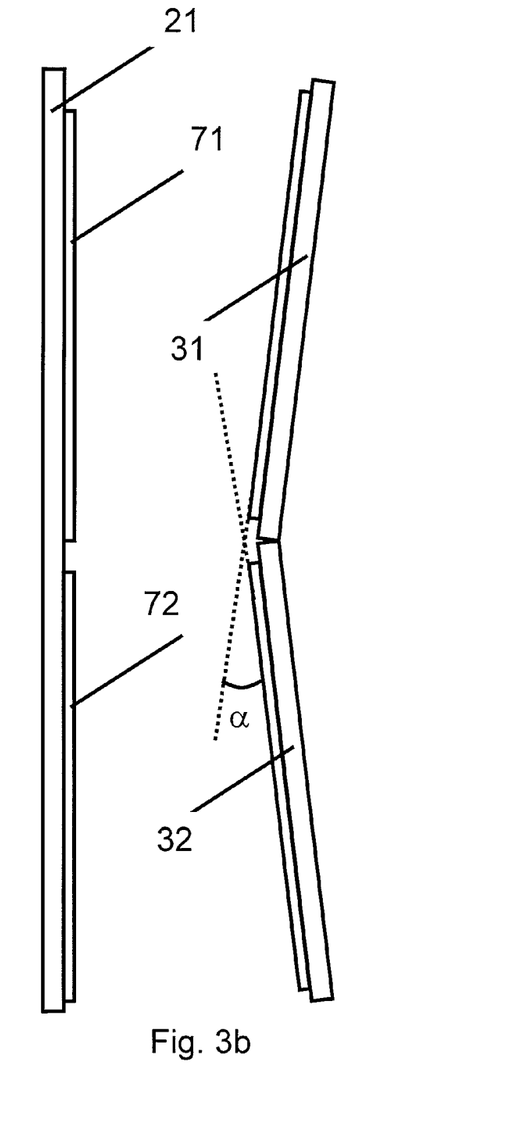
FIG. 3b shows a schematic drawing of a mask carrier and a substrate carrier.

FIGS. 3*a*, 3*b*, 4, and 5 present different implementations of mask carrier modules. FIG. 3*a* depicts a mask handling module 1 having a mask carrier 3 for carrying two masks 61, 62, wherein the planes including the masks 61, 62 form the angle α. The substrate 7 may have approximately an area that is as large as the combined area of the two masks 61, 62. The substrate 7 may also be larger. In such systems, two equal or different masks 61, 62 may be placed next to each other on the substrate 7 in order to completely cover the surface of the substrate 7. In FIG. 3*b* a configuration where the substrate carrier 2 is adapted to carry two substrates 71, 72 is shown. In such implementations, the masks 61, 62 and the substrates 71, 72 may have approximately the same area. The mask carrier sections 31, 32 may be pivotably mounted in order to switch between a first configuration having two masks and a second configuration with a single mask.

Figure 4A:
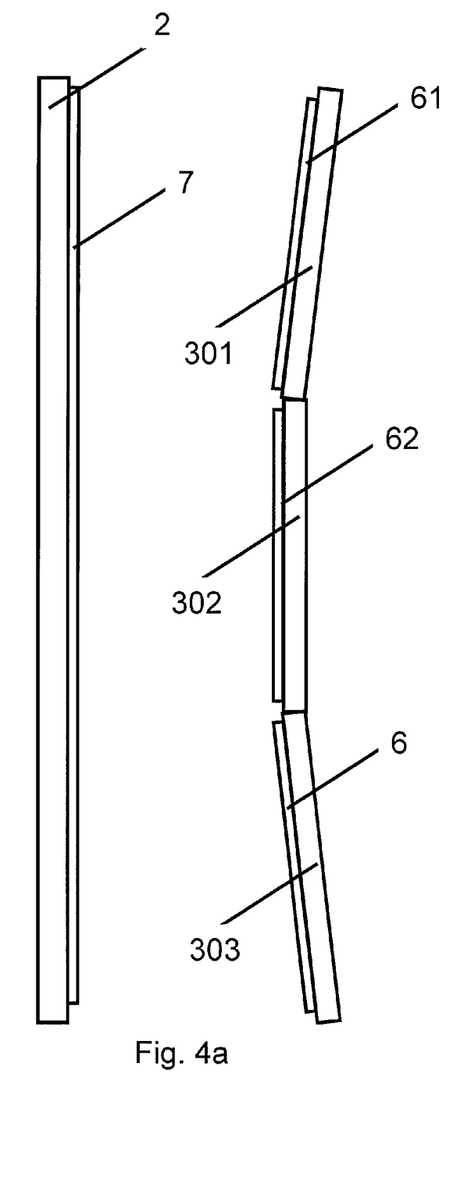
FIG. 4a shows a schematic drawing of a mask carrier and a substrate carrier having three mask carrier sections.
Figure 4B:
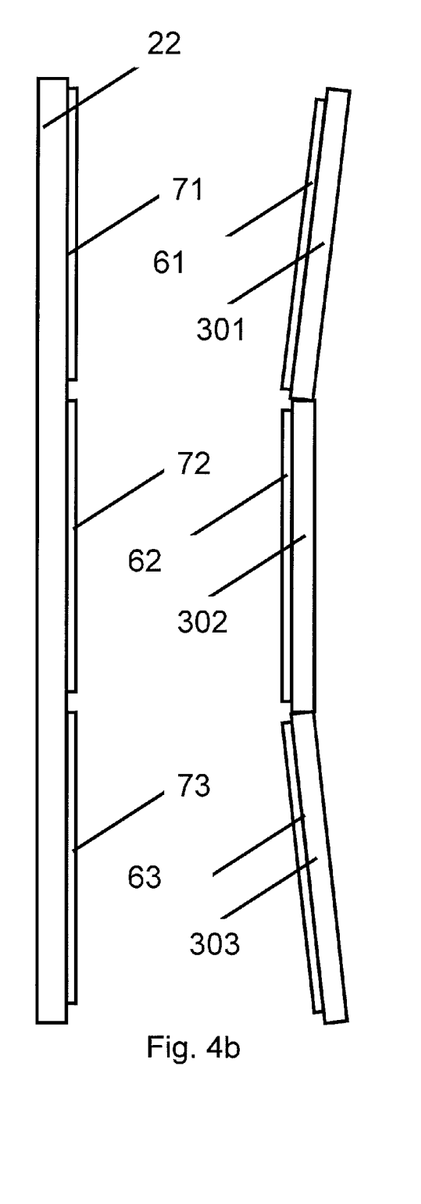
FIG. 4b shows a schematic drawing of a mask carrier and a substrate carrier having three mask carrier sections.
Figure 5:
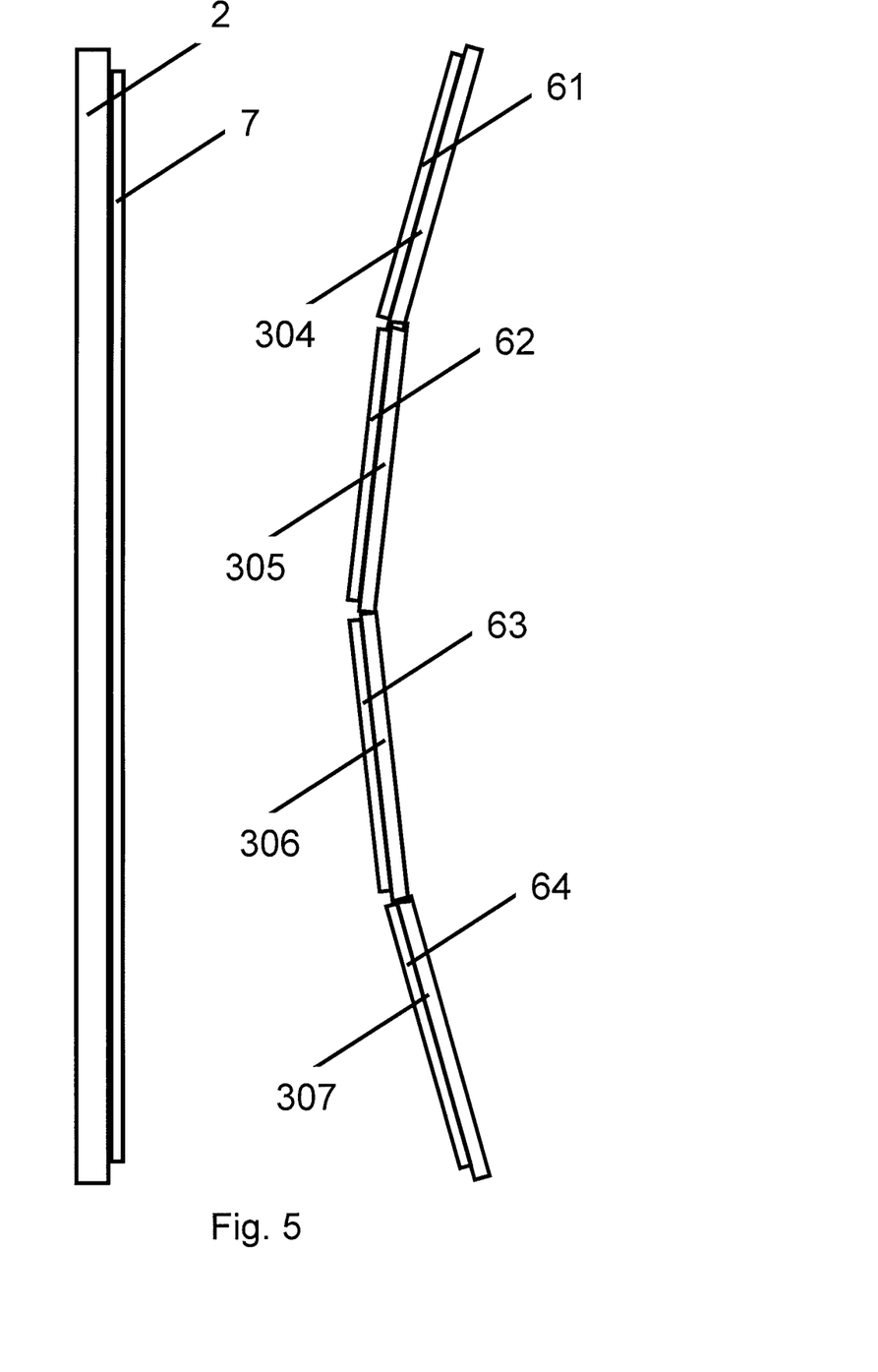

In FIGS. 4*a*, 4*b* and 5 configurations including three mask carrier sections 301, 302, 303 and four mask carrier sections 304, 305, 306, 307, respectively, are shown. Even though the figures show a configuration wherein the sections are arranged in a line, the mask handling modules 1 and mask carriers 3 may also include mask carrier sections arranged in other configurations. For instance, the mask carrier sections may be arranged in any configuration forming an m×n–array (m and n being integer numbers, usually both 2 or larger). In some implementations, the mask carrier sections may be arranged in a 2×2 array or in a 3×3 array, wherein each mask carrier section is configured to carry a mask included in a plane and all planes are forming angles with respect to each other. In such a configuration comprising more than two masks, the mask carrier 3 may be coupled to mask carrier positioning devices 39 at least configured to rotate the mask carrier about two orthogonal axes in order to move every mask coupled to the array of mask holder sections in a substantially coplanar arrangement with one or several substrates coupled to a substrate carrier. In such configurations, the features of the mask handling modules 1 having only two sections 31, 32, or three sections 301, 302, 304 and more sections arranged in a linear fashion can also be applied. Particularly, pivotable mounts can be disposed between some or all of the mask carrier sections. This may lead to a mask carrier 3 configurable in two dimensions. In addition, as in an array configuration the number of mask carrier sections may be large (e.g., larger than 3, 7, 15), it may also be efficient to include an alignment control system wherein all mask carrier sections share a single alignment control system which is optionally adapted to be moved to each mask carrier section. It may also be possible to equip every mask carrier section with a dedicated alignment control system.

Figure 2:
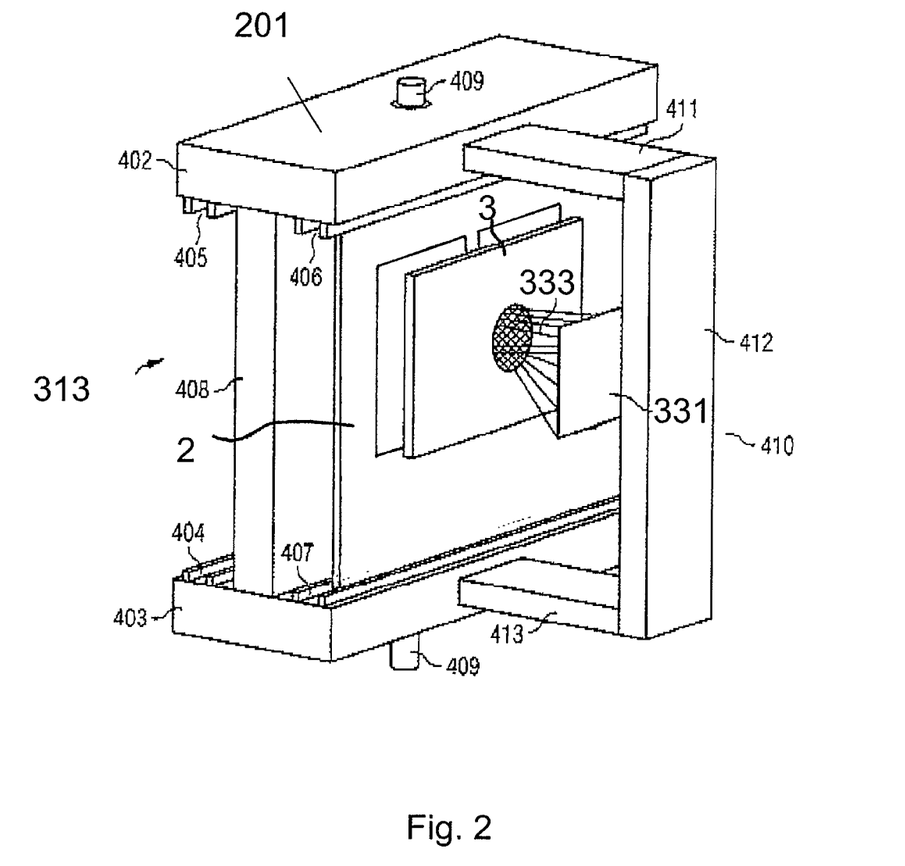
FIG. 2 shows a schematic drawing including a substrate carrier module and a mask handling module.

In FIG. 2, a mask handling module 313 is shown. In these implementations, the substrate carrier may be coupled to a rotatable substrate carrier module 201. Such a module may form part of an inline deposition facility for depositing multiple organic, inorganic and metal layers to form an organic semiconductor device. Detailed examples for such inline systems will be given below. In FIG. 2, a vertical arrangement of substrate 2 and mask carrier 3 is shown, but the devices and methods are also applicable in horizontal configurations. In the implementation shown in FIG. 2, the mask carrier is mounted on a U-shaped mount 410 comprising three bars 411, 412, 413 attached to the substrate carrier module 401. The mask carrier 3 is attached to a mount plate 331 which in turn is attached to the U-shaped mount 401. The mask carrier positioning device is a kinematic hexapod 333 including six separately controllable axes for positioning the mask carrier 3. Alternatively, other combinations of actuators may be employed, e.g. linear and rotational actuators including stepper drives, DC drives or other electronic drives. In alternative implementations, the actuators include hydraulic and/or pneumatic actuators. In FIG. 2, the mask carrier 3 is not drawn including the angled configuration, but rather in a schematic manner. The substrate carrier module 201 in FIG. 2 includes two substrate holders disposed on different sides of a rotatable mount formed by three plates 402, 403, 408 and comprising a rotational axis 409. In this implementation—the substrate holders include guard rails 404, 405, 406, 407 configured to hold a substrate carrier 2 at an upper and lower edge. Other configurations are also possible. In particular, the substrate carrier 2 may include a frame configured to carry an array of substrates. In order to provide a flexible substrate carrier system, the substrate carrier 2 may be configured to be changed from different configurations with a simple procedure. Alternatively, the substrate carrier 2 may be configured to carry a predetermined number of different substrate configurations without changing the substrate holder. For instance, the substrate carrier 2 of FIG. 2 may be equally configured to carry one substrate extending over the complete width or two substrates extending over substantially half the width of the substrate holder.

What is not shown in FIG. 2 are alignment control systems. Even though there may be systems working with sufficient precision to operate without alignment control systems, in some implementations, the mask handling modules 1 and mask carriers 3 include alignment control systems. The alignment control system can include any suitable sensor to detect whether a mask is positioned on or near a substrate at a predetermined position with sufficient precision. Preferably, this can be achieved by a camera or another optical sensor detecting the overlap of an alignment marker disposed on the substrate with a corresponding alignment marker disposed on the mask. Depending from the transmittance of the substrate and/or the mask at the operation wavelength of the alignment control systems, the alignment markers can be printed onto the substrate and/or the mask. Alternatively, the alignment markers can be cut through the substrate or mask material, particularly if the materials include metals. The alignment control system can be positioned behind the mask, or behind the substrate and operate in a transmission configuration. In other implementations, the alignment control system operates in a reflective manner.

The mask handling module 1 may include appropriate feedback circuitry to establish a closed-loop circuit to automatically control the approach of a mask onto a substrate. In some cases, it may suffice to solely laterally move the mask while approaching the substrate. In such cases, the remaining degrees of freedom have been already aligned before the final approach.

Figure 6:
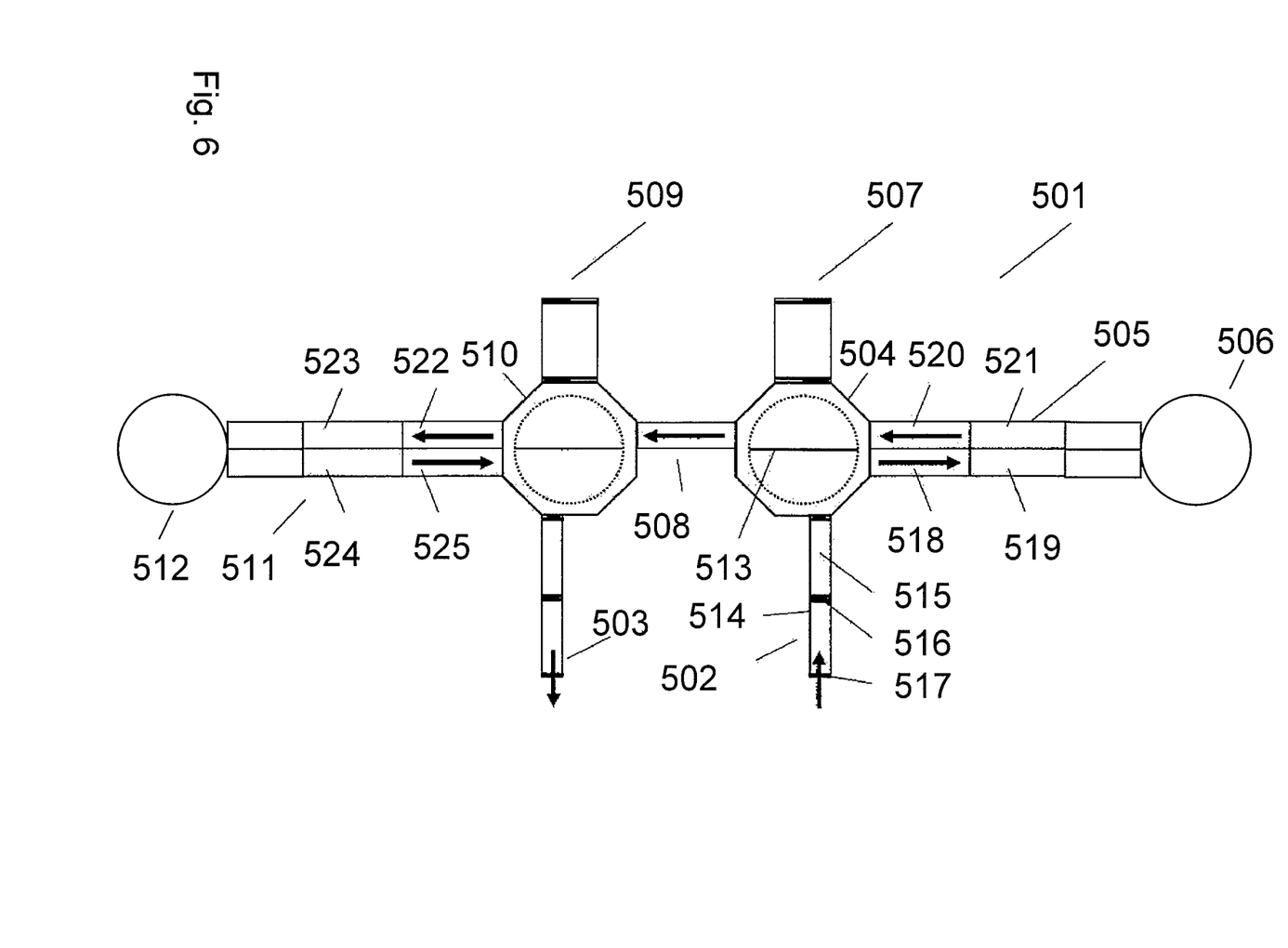
FIG. 6 shows a schematic drawing of a deposition system including mask handling modules.

The mask handling modules 1 and mask carriers 3 may preferentially be employed in systems for depositing organic semiconductors. An exemplary deposition system is depicted in FIG. 6. Usually, a state-of-the-art organic semiconductor device includes several layers wherein most of these layers comprise different materials. For instance, an organic light emitting diode may comprise an anode, a hole transport layer, a recombination layer, an electron transport layer and a cathode (additional hole and electron blocking layers are also possible). In organic semiconductor based display devices there might be additionally two, three or more different types of pixels corresponding to different colors, what may require at least different recombination layer composition and possibly also different other layers. Such systems may also require different lateral structures that may be produced by employing different masks. For instance, the anode and/or cathode may include structures to connect to collector lines and the different pixels may be formed by stacks of different materials. In inline systems, every layer is usually deposited using a different chamber with a dedicated source. With the mask carriers 3 and mask handling modules 1, such organic semiconductor devices can be efficiently produced in inline processes.

In the inline system 501 of FIG. 6 mask alignment chambers 510 and/or 504 may be equipped with mask handling modules 1. One or more substrates enter the in-line system through load-locks 514, 515 and are moved into the first mask alignment chamber 504 comprising a first mask handling module 513. The first mask handling module 513 may include any of the devices discussed above. In an exemplary case, the substrates may be equipped with two or more masks in the first mask alignment chamber 504. Exemplarily, the masks may be shadow masks to structure a metal or organic semiconductor layer. The substrate may then be turned by the first mask handling module and fed into a first series of transfer and process chambers 518, 519 where one or several process steps, e.g. the deposition of a first series of layers through the first set of shadow masks is performed. In a first reversal chamber 506 the substrate is turned by 180° and fed back into a second series of transfer and process chambers 505, 520, 521 where a second series of process steps can be carried out. Afterwards, the substrates return to the first mask alignment chamber 504, where the masks may be removed and/or a second set of masks may be placed onto the substrates. By turning the mask alignment module 513 this step can be performed by a single mask carrier. The new set of masks may be stored and fed from/to the mask handling modules by and from a mask storage modules 507, 509. In a next step, the substrates may be fed into a transfer chamber 508 that moves them into a consecutive stage. This stage can include either a pure substrate rotation chamber 510 or a second mask alignment chamber 510 including a second mask handling module. Depending on the previous steps the substrates may be equipped with another set of masks and fed to a third series of transfer and process chambers 522, 523, a second reversal chamber 512 and a fourth series of transfer and process chambers 511, 524, 525. At the end of the process the substrates exit the system through a second load-lock 503. In such manner, a complex device can be manufactured in-line under vacuum conditions. By employing mask handling modules, the above described inline system 501 could be loaded with two substrates respectively masks in a first deposition run to produce a first type of devices. Then in a second run, the inline system could be loaded with a higher number of substrates, e.g. 16, and respective masks. The remaining infrastructure of the inline system may remain unchanged. Given the complexity and number of process steps involved in typical production processes, such flexibility may be especially useful in the field of organic semiconductors.

Even though many implementations have been described relating to organic semiconductor devices, in particular organic light emitting devices, the devices and methods can also be employed in other fields.

For instance, the devices and methods can also be employed in other fields of technology employing masks. The devices and methods can be transferred to deposition systems employing shadow masks but no organic semiconductor materials. These fields comprise inorganic semiconductor devices, but also other thin film technologies as, for example, optical coating technology, thin film battery technology, fuel cell technology and so forth. The above-mentioned advantages of the mask handling modules and mask carriers also arise in said fields.

In other instances, the devices and methods may be also employed in other fields of technology not involving film deposition but also involving masks. Amongst these fields of technologies range lithography processes, where the devices and methods may be employed to place and pick lithography masks. As in the field of organic semiconductors, increasing substrate sizes and back-compatibility is also an issue in the field of lithography.

Figure 7A:
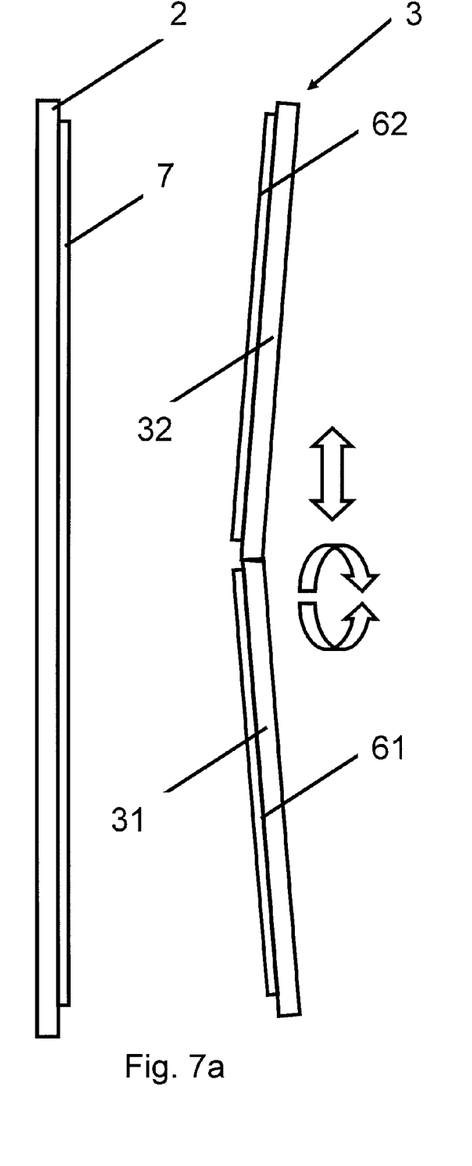
FIG. 7 shows in sections 7a to 7d an alignment of two masks.
Figure 7B:
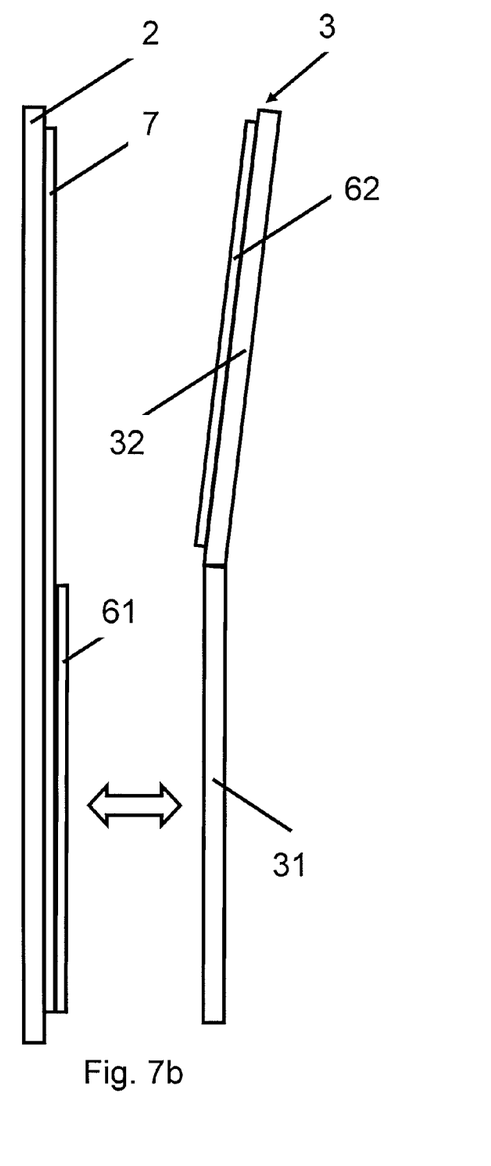
Figure 7C:
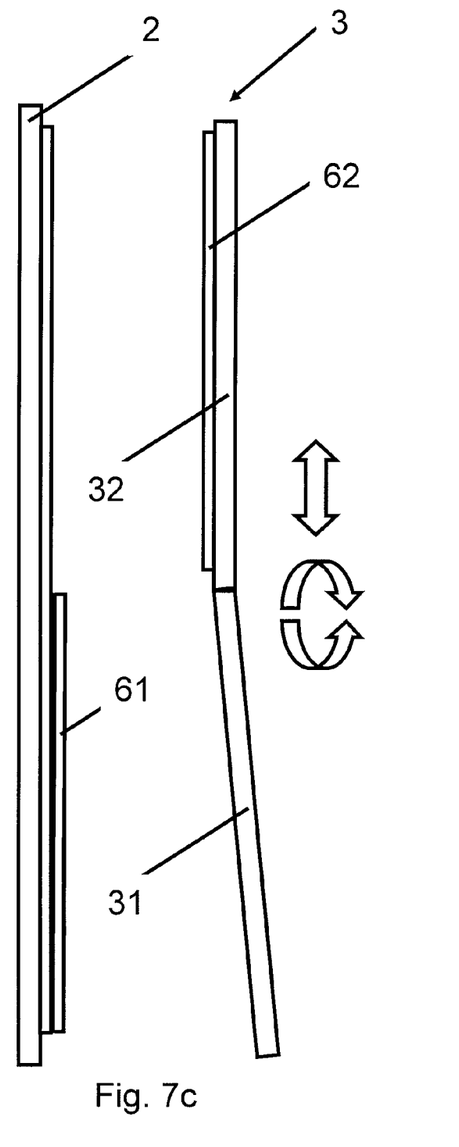
Figure 7D:
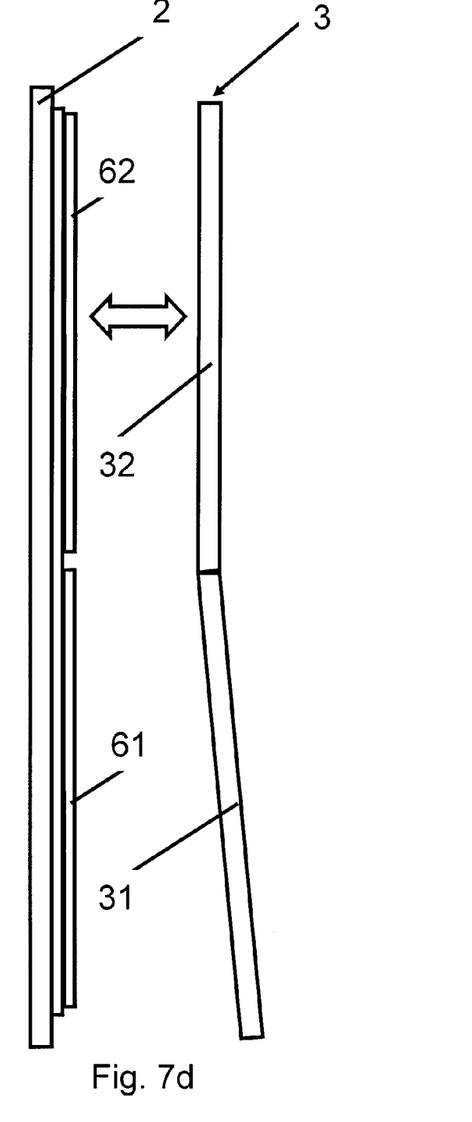

FIGS. 7a to 7d depicts the method steps of a method. In a first step shown in FIG. 7a, a first mask 61 is aligned to a substrate 7 carried by a substrate carrier 2 by moving the mask carrier 3 for carrying two masks 31, 32 relative to the substrate carrier 2. Then, as depicted in FIG. 7b, the mask 31 is placed at a predetermined position on the substrate 7. In case the mask should be picked from the substrate, the mask carrier is first aligned to then pick the mask from the substrate. Afterwards, in a second step shown in FIG. 7c, a second mask 62 of the two masks 61, 62 is aligned to the substrate 7 carried by the substrate carrier 2 by tilting the mask carrier with respect to the substrate 7. In a last step depicted in FIG. 7d, the second mask 32 is placed at a second predetermined position on the substrate 7. In cases where there are more than two masks involved, the methods include a respective repetition of the afore-mentioned steps until all masks have been aligned. The above explained method can be executed by using a position alignment system. This may monitor the position of the mask carrier and the relative position of the mask and the substrate and to control the alignment of the mask in response to the relative position.

Figure 8:
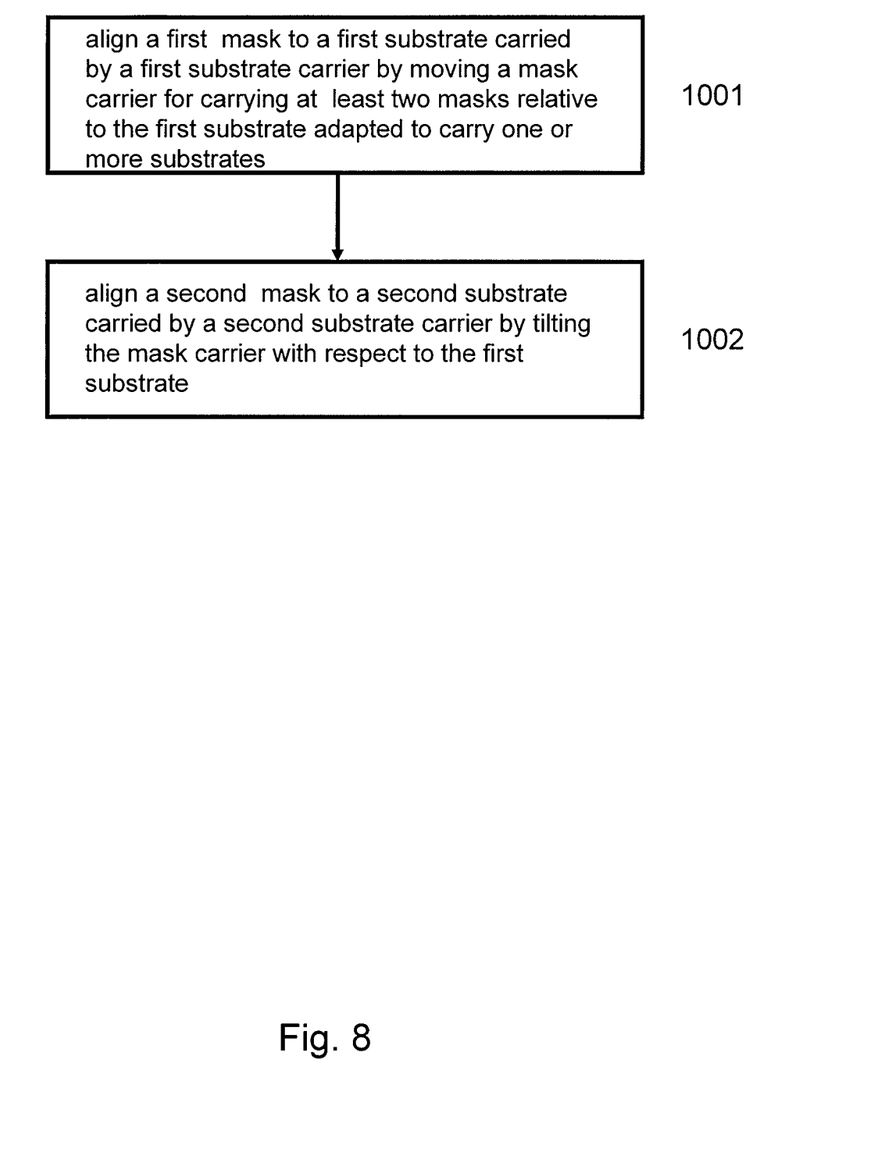
FIG. 8 is a flow chart of a method.

FIG. 8 presents another implementation of a method. In this case, two masks are aligned with respect to a single substrate. In a first step, the mask carrier is aligned to be coplanar with the plane including the substrate. This step may include rotation of the mask carrier about an axis substantially parallel to the plane including the substrate. Then, the mask approaches the substrates. If necessary, additional lateral alignment is carried out by a closed-loop circuit using the input of alignment control systems. After the mask has been placed onto the substrate, the process is repeated with the second of the two masks. The angled configuration secures that both masks can be placed independently without any interference.

As an alternative to the claims, this technology may be defined by any of the following embodiments:

Embodiment 1 is directed to a mask handling module (1), preferably including the mask carrier according to any of embodiments 13 to 22, for aligning a mask to a substrate, comprising:
 a substrate carrier (2) for carrying at least one substrate;
 a mask carrier (3) for carrying at least two masks, wherein the mask carrier comprises at least two mask carrier sections (31, 32; 301, 302, 303; 304, 305, 306, 307) each being adapted to carry a mask;
 a mask carrier positioning device (39) for moving the mask carrier (3) relative to the substrate carrier (2);
 wherein the mask carrier sections (31, 32; 301, 302, 303; 304, 305, 306, 307) are arranged so that the masks carried on the mask carrier sections (31, 32; 301, 302, 303; 304, 305, 306, 307) can be positioned on the mask carrier (3) in respective planes forming an angle (α) with respect to each other so that only one of the at least two masks can be aligned to one of the at least one substrates.

Embodiment 2 is directed to the mask handling module of embodiment 1, wherein while one of the at least two masks is aligned the at least one other mask does not come into contact with any of the at least one substrates.

Embodiment 3 is directed to the mask handling module of embodiment 1 or 2, wherein the mask carrier positioning device (39) is adapted to bring at least one of the at least two masks into contact with one of the at least one substrates.

Embodiment 4 is directed to the mask handling module of any of embodiments 1 to 3, wherein the mask carrier positioning device (39) is adapted to align the at least one of the least two masks coplanar to one of the at least one substrates.

Embodiment 5 is directed to the mask handling module of any of embodiments 1 to 4, wherein the substrate carrier (2) is adapted to carry two or more substrates.

Embodiment 6 is directed to the mask handling module of any of embodiments 1 to 5, wherein the substrate carrier (2) is configured to carry the at least one substrates in a single planar plain.

Embodiment 7 is directed to the mask handling module of any of embodiments 1 to 6, wherein the mask handling module (1) is adapted so that two of the at least two masks can be aligned to one of the at least one substrates.

Embodiment 8 is directed to the mask handling module of any of embodiments 1 to 6, wherein the mask handling module (1) is adapted so that each mask is aligned to a different substrate.

Embodiment 9 is directed to the mask handling module of any of embodiments 1 to 8, wherein the substrate carrier (2) is adapted to carry at least one substrate having a size between 100×125 mm to 3000×3700 mm, optionally between 400×500 mm to 1500×1850 mm, further optionally between 600×700 mm to 1200×1300 mm, and further optionally between 730×920 mm and 1020×1200 mm.

Embodiment 10 is directed to the mask handling module of any of embodiments 1 to 9, wherein the mask carrier positioning device (39) comprises a six-axis movement control (333).

Embodiment 11 is directed to the mask handling module of any of embodiments 1 to 10, wherein the substrate carrier (2) and the mask carrier (3) are arranged so that the at least one substrate and the at least two mask can be held in substantially vertical positions.

Embodiment 12 is directed to the mask handling module of any of embodiments 1 to 11, wherein the mask handling module (1) is suitable to be used in a vacuum environment, especially inside a vacuum deposition system.

Embodiment 13 is directed to a mask carrier for carrying at least two masks; the mask carrier (3) comprising at least two mask carrier sections (31, 32; 301, 302, 303; 304, 305, 306, 307) each being adapted to carry a mask; wherein the mask carrier sections (31, 32; 301, 302, 303; 304, 305, 306, 307) are arranged so that the masks carried on the mask carrier sections (31, 32; 301, 302, 303; 304, 305, 306, 307) can be positioned on the mask carrier (3) in respective planes forming an angle (α) with respect to each other.

Embodiment 14 is directed to the mask carrier of embodiment 13, wherein the at least two mask carrier sections (31, 32; 301, 302, 303; 304, 305, 306, 307) are fixedly positioned with respect to each other.

Embodiment 15 is directed to the mask carrier of embodiment 13, wherein the at least two mask carrier sections (31, 32; 301, 302, 303; 304, 305, 306, 307) are pivotably mounted with respect to each other.

Embodiment 16 is directed to the mask carrier of any of embodiments 13 to 15, wherein the angle (α) is the acute angle formed by the respective planes and the angle (α) is in the range from 0.01° to 30°, optionally from 0.1° to 10°, further optionally from 0.5° to 5°, further optionally from 0.5° and 1.5°.

Embodiment 17 is directed to the mask carrier of any of embodiments 13 to 16, wherein each mask carrier sections (31, 32; 301, 302, 303; 304, 305, 306, 307) is adapted to carry a mask having a size between 210×260 mm to 3200×4000 mm, optionally between 420×520 mm to 1600×2000 mm, further optionally between 460×560 mm to 1260×1360 mm, further optionally between 500×600 mm to 1020×1220 mm.

Embodiment 18 is directed to the mask carrier of any of embodiments 13 to 17, wherein the mask carrier (3) comprises at least one alignment control device.

Embodiment 19 is directed to the mask carrier of embodiment 18, wherein each mask carrier section (31, 32; 301, 302, 303; 304, 305, 306, 307) is equipped with a respective alignment control device.

Embodiment 20 is directed to the mask carrier of embodiment 18, wherein all mask carrier sections (31, 32; 301, 302, 303; 304, 305, 306, 307) share a single alignment control device which is optionally adapted to be moved to each mask carrier section (31, 32; 301, 302, 303; 304, 305, 306, 307).

Embodiment 21 is directed to the mask carrier of any of embodiments 13 to 20, wherein the mask carrier sections (31, 32; 301, 302, 303; 304, 305, 306, 307) comprise switchable magnets for carrying masks comprising permanent metallic sheet material.

Embodiment 22 is directed to the mask carrier of any of embodiments 13 to 21, wherein the mask carrier (3) is adapted to be used inside a vacuum chamber.

Embodiment 23 is directed to a method for aligning a mask to a substrate in a mask handling module, preferably in the mask handling module of one of the embodiments 1 to 12, comprising:
  aligning a first mask to a first substrate carried by a first substrate carrier by moving a mask carrier for carrying at least two masks relative to the first substrate carrier adapted to carry one or more substrates (1001),
  aligning a second mask of the at least two masks to a second substrate carried by a second substrate carrier by tilting the mask carrier with respect to the first substrate (1002).

Embodiment 24 is directed to the method of embodiment 23, wherein the first substrate and the second substrate denote the same substrate or different substrate; and wherein the first substrate carrier and the second substrate carrier denote the same substrate carrier or different substrate carriers.

Embodiment 25 is directed to the method of embodiment 23 or 24, the first mask and the second mask are aligned to the same substrate.

Embodiment 26 is directed to the method of any of embodiments 23 to 25, wherein the first mask and the second mask are attached to the substrate.

Embodiment 27 is directed to the method of any of embodiments 23 to 25, wherein the first mask and the second mask are attached to different substrates carried either by the same substrate carrier or carried by different substrate carriers.

Embodiment 28 is directed to the method of any of embodiments 23 to 27, wherein the first mask and the second mask are aligned coplanar to the respective substrate.

The invention claimed is:

1. A mask handling module for aligning a mask to a substrate, comprising:
   a substrate carrier for carrying at least one substrate;
   a mask carrier for carrying at least two masks, wherein the mask carrier comprises at least two mask carrier sections each being adapted to carry a mask; and
   an actuator coupled to the mask carrier to move the mask carrier relative to the substrate carrier,
   wherein the mask carrier sections are arranged so that the masks carried on the mask carrier sections can be positioned on the mask carrier in respective planes forming a nonzero angle with respect to each other, wherein the nonzero angle is in the range from 0.01° to 30°, so that only one mask at a time of the at least two masks can be aligned to one of the at least one substrate, wherein the actuator is adapted to bring the one of the at least two masks into contact with the one of the at least one substrate, wherein at least a part of the mask handling module is configured to operate under vacuum conditions, and wherein the substrate carrier and the mask carrier are arranged so that the at least one substrate and the at least two masks can be held in substantially vertical positions.

2. The mask handling module of claim 1, wherein while the one of the at least two masks is aligned to one of the at least one substrate, the at least one other mask does not come into contact with the one of the at least one substrate.

3. The mask handling module of claim 1, wherein the actuator is adapted to align the one of the at least two masks coplanar to one of the at least one substrate.

4. The mask handling module of claim 1, wherein the substrate carrier is adapted to carry two or more substrates.

5. The mask handling module of claim 4, wherein the mask handling module is adapted so that each mask of the at least two masks aligns to a different substrate.

6. The mask handling module of claim 1, wherein the actuator comprises a six-axes movement control.

7. The mask handling module of claim 1, wherein the mask carrier sections are arranged in a fixed orientation relative to each other.

8. The mask handling module of claim 7, wherein the actuator is adapted to tilt the mask carrier relative to the substrate carrier about an axis parallel to the at least one substrate.

9. The mask handling module of claim 1, wherein the mask carrier is adapted to leave the one of the at least two masks on the one of the at least one substrate when the actuator moves the mask carrier away from the substrate carrier.

10. The mask handling module of claim 1, wherein the actuator is configured to rotate the mask carrier about an axis parallel to the respective planes.

* * * * *